United States Patent
Jamil

(10) Patent No.: US 6,678,952 B2
(45) Date of Patent: Jan. 20, 2004

(54) METHOD OF MAKING A MICROELECTRONIC PACKAGE INCLUDING A COMPONENT HAVING CONDUCTIVE ELEMENTS ON A TOP SIDE AND A BOTTOM SIDE THEREOF

(75) Inventor: Owais Jamil, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 96 days.

(21) Appl. No.: 09/916,554

(22) Filed: Jul. 27, 2001

(65) Prior Publication Data

US 2002/0078561 A1 Jun. 27, 2002

Related U.S. Application Data

(60) Provisional application No. 60/222,868, filed on Aug. 3, 2000.

(51) Int. Cl.[7] .............................. H05K 3/02; H01K 3/22; H01K 3/10
(52) U.S. Cl. ............................ 29/847; 29/846; 29/835; 29/848; 29/852; 174/254
(58) Field of Search .................. 29/846, 847, 835, 29/848, 852; 174/254, 255, 262; 257/696, 684, 688

(56) References Cited

U.S. PATENT DOCUMENTS

| | | | | |
|---|---|---|---|---|
| 5,518,964 A | * | 5/1996 | DiStefano et al. | 438/113 |
| 5,556,812 A | * | 9/1996 | Leuschner et al. | 438/623 |
| 5,763,941 A | * | 6/1998 | Fjelstad | 257/669 |
| 5,801,441 A | | 9/1998 | DiStefano et al. | |
| 6,222,136 B1 | * | 4/2001 | Appelt et al. | 174/254 |

* cited by examiner

Primary Examiner—Carl J. Arbes
Assistant Examiner—Thiem Duh Phan
(74) Attorney, Agent, or Firm—Lerner, David, Littenberg, Krumholz & Mentlik, LLP

(57) ABSTRACT

A microelectronic element is formed from a structure including metal layers on top and bottom sides of a dielectric. Apertures are formed in the top metal layer, and vias are formed in the dielectric in alignment with the apertures. Top and bottom conductive features are formed in proximity to the vias, as by selectively depositing a metal on the metal layers or selectively etching the metal layers. The top and bottom conductive features are connected to one another by depositing a conductive material into the vias, most preferably without seeding the vias as, for example, by depositing solder in the vias.

26 Claims, 13 Drawing Sheets

METHOD OF MAKING A MICROELECTRONIC PACKAGE INCLUDING A COMPONENT HAVING CONDUCTIVE ELEMENTS ON A TOP SIDE AND A BOTTOM SIDE THEREOF

CROSS-REFERENCE TO RELATED APPLICATIONS

This application claims benefit of Provisional Application No. 60/222,868, filed Aug. 3, 2000, the disclosure of which is hereby incorporated by reference herein.

FIELD OF THE INVENTION

The present invention relates to methods of making microelectronic packages, and to methods of making microelectronic components for use in fabrication of microelectronic packages.

BACKGROUND OF THE INVENTION

Microelectronic elements, such as semiconductor chips, are typically incorporated in a microelectronic package having terminals for forming electrical connections between the semiconductor chip and a second microelectronic element. Methods of making a microelectronic package typically include assembling the semiconductor chip with a microelectronic component. The microelectronic component incorporates conductive features for connecting with contacts on the semiconductor chip and for connecting with the second microelectronic element.

The microelectronic component may comprise a dielectric layer including conductive features on both of the two major surfaces of the dielectric layer. Vias, which comprise holes that extend from one major surface to another major surface of the dielectric layer, are typically used to form electrical connections between features on each major surface.

After a via is formed in a dielectric layer, the vias are bounded by walls of the dielectric layer. The vias are lined with an electrically conductive material so that the conductive features on one major surface are electrically connected to conductive features on the other major surface. To line the vias with conductive material, the vias are first "seeded" by lining the vias with a small amount of electrically conductive material so as to cover the dielectric walls of the via. Additional electrically conductive material can then be electroplated onto the seeded vias. After the vias are lined, terminals for connecting to the second microelectronic element are formed in contact with the vias. Lining the vias by seeding the vias and then electroplating conductive material in the vias is time consuming and expensive.

Components having conductive features on two sides, or "two metal components," are typically made by forming conductive features on one side of the component separately from the conductive features on the other side of the component. A two metal component may be formed from a dielectric layer having a layer of metal on each of the major surfaces of the dielectric layer. Photolithographic techniques are used to form the conductive features on both sides of the dielectric layer. The conductive features on one side of the dielectric layer are formed before the vias are formed. After vias are formed, the vias are lined and then the conductive features on the other side of the dielectric layer are formed. Multiple steps are required in forming the conductive features from the top metal layer, forming and lining the vias, and forming conductive features from the bottom metal layer separately.

Further improvements in forming microelectronic components and microelectronic packages are desired.

SUMMARY OF THE INVENTION

In a first aspect of the present invention, a method of forming a microelectronic element comprises providing a dielectric layer with a top side, a bottom side, a top metal layer on the top side, and a bottom metal layer on the bottom side. First apertures are formed in the top metal layer and vias are formed in the dielectric layer so that the vias are aligned with the first apertures. A first resist is applied to the top metal layer and a second resist is applied to the bottom metal layer. The first resist and second resist are patterned in the same step to form first openings in the first resist and second openings in the second resist. The first openings leave uncovered portions of the top metal layer surrounding the vias, and the second openings are aligned with the first openings. Top conductive features are formed from portions of the top metal layer aligned with said first openings and bottom conductive features are formed on portions of the bottom metal layer aligned with said second openings. The top conductive features and the bottom conductive features are electrically interconnected through the vias by depositing an electrically conductive material in the vias without seeding the vias.

Thus, the resists are patterned in the same step to simplify the method and require less time in forming conductive features on the top and bottom sides of a component. In addition, vias are formed to interconnect the top conductive features and bottom conductive features. Electrically conductive material is deposited in the vias to interconnect the top conductive features and bottom conductive features, without first lining the vias.

In certain preferred embodiments, the step of forming first apertures is performed before applying a first resist and applying a second resist. The step of patterning the first resist and second resist preferably comprises photolithographically patterning the first resist and second resist. The step of patterning preferably comprises exposing the first resist and second resist in the same step and then developing the first resist and the second resist in the same step. Such patterning of the first resist and second resist greatly simplifies the method.

The top conductive features may have a number of shapes. For example, the top conductive features may be formed as annular features surrounding the vias.

The conductive features may be formed by removing metal from the top metal layer, the bottom metal layer or both. The conductive features may also be formed by adding metal to the top metal layer, the bottom metal layer or both. In certain preferred embodiments, the step of forming the bottom conductive features includes depositing a first metal in the second openings of the second resist.

In certain preferred embodiments, a second metal is added on the first metal deposited in the second openings of the second resist. The second metal may also be added on the top metal layer, on the portions of the top metal layer left uncovered by the first openings. The step of forming top conductive features and bottom conductive features may comprise removing metal from portions of the top metal layer and the bottom metal layer that are left uncovered by the second metal. Thus, the second metal is utilized in forming the top conductive features and bottom conductive features. Preferably, the second metal is added on the top metal layer and bottom metal layer in the same step, further simplifying the method.

The second metal preferably has different etching characteristics than the etching characteristics of the top metal layer and the bottom metal layer. Metal may be removed from the top metal layer and the bottom metal layer by etching. For example, the first metal may comprise copper and the second metal may comprise gold. The top metal layer and the bottom metal layer may also comprise layers of copper.

In certain preferred embodiments, a third resist is applied, covering the second metal and the bottom metal layer. The third resist is patterned to form third openings in the third resist. The third openings uncover a portion of the second metal deposited on the first metal. Second metal is deposited in the third openings to form pads for the bottom conductive features.

In certain preferred embodiments, the step of forming first apertures in the top metal layer comprises applying a third resist on the top metal layer, patterning the third resist to form third openings, and removing metal from portions of the top metal layer left uncovered in the third openings. The step of forming vias may comprise cutting through the dielectric layer at the first apertures.

In another aspect of the present invention, a method of making a microelectronic package comprises providing a dielectric layer having a top side and a bottom side. A top conductive feature is formed on the top side of the dielectric layer and a bottom conductive feature is formed on the bottom side of the dielectric layer. The dielectric layer is juxtaposed with at least one microelectronic element having contacts. The contacts of the microelectronic element are bonded with the bottom conductive features. A via is formed through the dielectric layer either before or after said bonding step. The via is aligned with the top conductive feature and the bottom conductive feature. The top conductive feature and the bottom conductive feature are electrically interconnected.

The step of electrically interconnecting preferably comprises depositing electrically conductive material in the vias without seeding the vias.

In another aspect of the present invention, a method of making a microelectronic component comprises providing a dielectric layer with a top side, a bottom side, a top metal layer on the top side, and a bottom metal layer on the bottom side. First apertures are formed in the top metal layer and top conductive features surrounding the first apertures are formed from portions of the top metal layer. Bottom conductive features are formed at portions of the bottom metal layer. The bottom conductive features are aligned with the first apertures. Vias are formed in the dielectric layer so that the vias are aligned with the first apertures. The top conductive features and the bottom conductive features are electrically interconnected through the vias by depositing electrically conductive material in the vias without seeding the vias.

In certain preferred embodiments, the first apertures and top conductive features are formed by applying a first resist to the top metal layer, and patterning the first resist to form first openings. The first apertures and top conductive features are formed by removing metal from portions of the top metal layer uncovered in the first openings. The bottom conductive features are formed by applying a second resist to the bottom metal layer and patterning the second resist to form second openings.

The bottom conductive features may be formed by adding a first metal to the portions of the bottom metal layer that are uncovered in the second openings. In certain preferred embodiments, a second metal is added on the first metal in the second openings. A third resist may be applied over the second metal and the bottom metal layer. The third resist may be patterned to form third openings in the third resist that uncover a portion of the second metal deposited on the first metal. A second metal may be added in the third openings to form pads on the bottom conductive features.

In a further aspect, a method of forming a microelectronic package comprises providing a dielectric layer with a top side, a bottom side, a top metal layer on the top side, and a bottom metal layer on the bottom side. First apertures are formed in the top metal layer and vias are formed in the dielectric layer aligned with the first apertures. A first resist is applied to the top metal layer, and a second resist is applied to the bottom metal layer. The first resist and second resist are patterned in the same step to form first openings in the first resist and second openings in the second resist. The first openings leave uncovered portions of the top metal layer surrounding the vias, and the second openings are aligned with the first openings. Top conductive features are formed from portions of the top metal layer aligned with said first openings and bottom conductive features are formed on portions of the bottom metal layer aligned with said second openings. The dielectric layer is juxtaposed with a microelectronic element so that the bottom conductive features are aligned with contacts of the microelectronic element. The top conductive features and the bottom conductive features are electrically interconnected through the vias by depositing electrically conductive material in the vias without seeding the vias.

The bottom conductive features are preferably bonded to the contacts of the microelectronic element. The bottom conductive features may include pads at an end of the bottom conductive features and the method may include bonding the pads to the contacts of the microelectronic element.

In certain preferred embodiments, the microelectronic element and the dielectric layer are moved with respect to one another after the step of bonding so that the bottom conductive features are deformed into a vertically extensive shape. The step of electrically interconnecting may be performed after the step of moving.

In another aspect of the invention, a method of making a microelectronic package comprises providing a dielectric layer with a top side, a bottom side, a top metal layer on the top side, and a bottom metal layer on the bottom side. First apertures are formed in the top metal layer and top conductive features are formed surrounding the first apertures. The top conductive features are formed from portions of the top metal layer. Bottom conductive features are formed at portions of the bottom metal layer. The bottom conductive features are aligned with the first apertures. A microelectronic element is juxtaposed with the dielectric layer so that the bottom conductive features are aligned with contacts of the microelectronic element. Vias are formed in the dielectric layer, either before or after the step of juxtaposing. The vias are aligned with the first apertures. The top conductive features and the bottom conductive features are electrically interconnected through the vias by depositing electrically conductive material in the vias without seeding the vias. The electrically interconnecting is performed either before or after the step of juxtaposing.

Preferably, the bottom conductive features are bonded to the contact of the microelectronic element. The bottom conductive features may include pads at an end of the bottom conductive features and the method may include bonding the pads to the contacts of the microelectronic element.

In certain preferred embodiments, the microelectronic element and the dielectric layer are moved with respect to one another after the step of bonding so that the bottom conductive features are deformed into a vertically extensive shape. The step of electrically interconnecting may be performed after the step of moving.

Methods in accordance with embodiments of the invention provide a two-metal component, or a package utilizing a two-metal component, with fewer steps and greater flexibility.

BRIEF DESCRIPTION OF THE DRAWINGS

These and other features, aspects and advantages of the present invention will become better understood with regard to the following description, appended claims, and accompanying drawings where:

DETAILED DESCRIPTION

Figure 1:
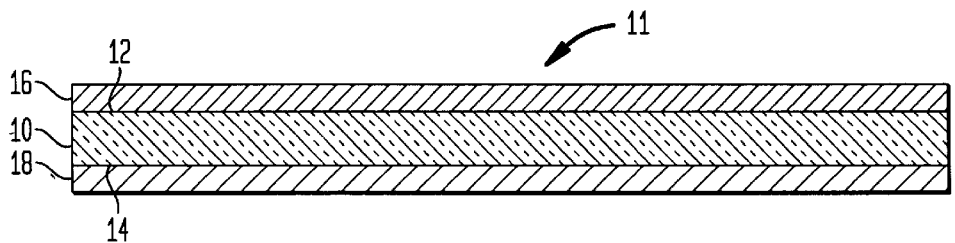
FIG. 1 is a schematic, cross-sectional view of a structure in a method in accordance with an embodiment of the invention.

A method in accordance with an embodiment of the invention is shown in FIGS. 1–17. FIG. 1 shows a structure 11 having a dielectric layer 10 with a top side 12 and a bottom side 14, a top metal layer 16 on the top side 12, and a bottom metal layer 18 on the bottom side 14. As used herein, the terms "top," "bottom" and other directional terms are to be taken as relative to the microelectronic element, rather than directions based on gravity.

In certain preferred embodiments, the dielectric layer comprises a sheet of polyimide and the top metal layer and bottom metal layer comprise layers of copper. The top metal layer and bottom metal layer may comprise relatively thin layers of copper, as compared to the thickness of the dielectric layer. For example, the dielectric layer may comprise a layer of polyimide having a thickness of 50 microns and the top metal layer and bottom metal layer may comprise copper layers each having a thickness of 3 microns. Layers of other metals and layers of other dielectric materials may also be used.

The structure 11 preferably comprises a copper clad layer of polyimide that may include a tie coat of, for example, chrome between the layer of polyimide and the layers of copper. The structure 11 may include layers of other material interposed between the top metal layer and the dielectric layer and between the bottom metal layer and the dielectric layer, such as layers of adhesive. Such structures are commercially available. In certain preferred embodiments, the dielectric layer includes internal conductive structures. The dielectric layer may comprise a rigid board, such as FR4, FR5 or BT board. The dielectric layer preferably comprises a flexible layer.

Figure 2:
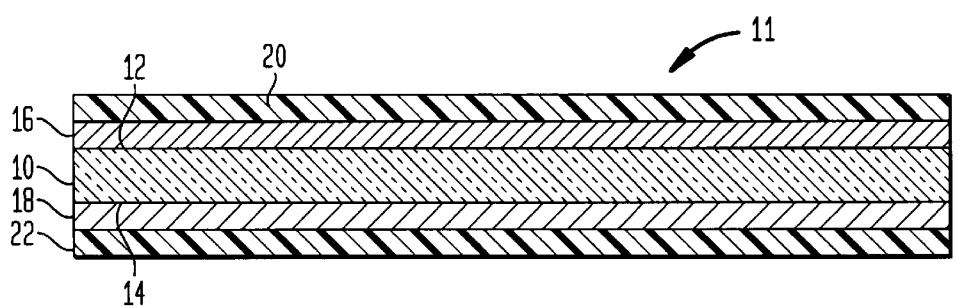
FIG. 2 is the cross-sectional view of FIG. 1, at a later stage in the method.
Figure 3:
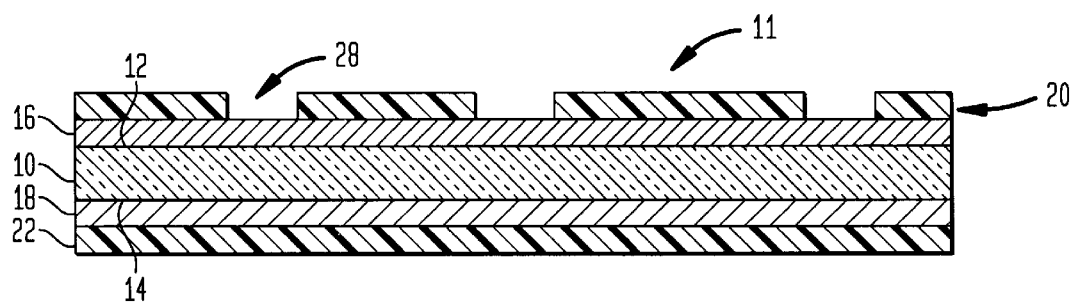
FIG. 3 is the cross-sectional view of FIG. 2, at a later stage in the method.

As shown in FIG. 2, a first resist layer 20, is applied to the top metal layer 16 and a second resist layer 22 is applied to the bottom metal layer 18. The resist layers may be electrodeposited, spin coated, or otherwise applied. The first resist layer 20 is preferably photolithographically patterned to form openings 28 in the first resist layer 20, as shown in FIG. 3. Photolithographic patterning is known in the field of microelectronic manufacturing, packaging and other fields. In photolithographic patterning, the first resist layer 20 is exposed to a source of light, or other form of energy, through a mask allowing the light or other form of energy to pass through portions of the mask to form exposed portions and unexposed portions of the first resist layer 20. In exposing the first resist layer 20, visible light, ultraviolet light, X-ray radiation, or infrared light may be used.

Resist layer 20 is developed to remove the unexposed portions of the first resist layer 20, forming openings 28 in the first layer 20 (FIG. 3).

Figure 4:
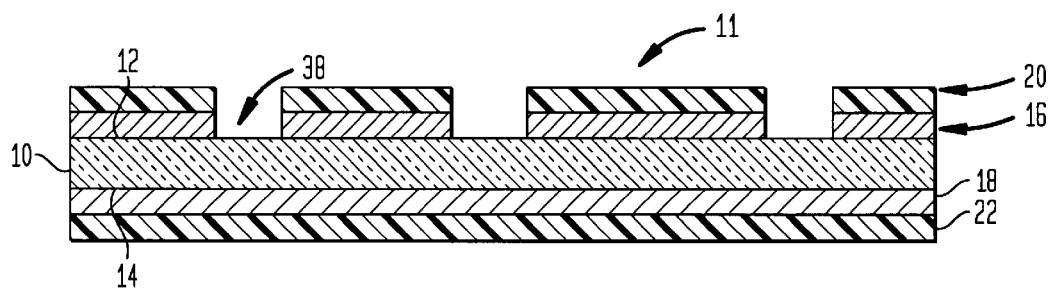
FIG. 4 is the cross-sectional view of FIG. 3, at a later stage in the method.

As shown in FIG. 4, metal is removed from the portions of top metal layer 16 left uncovered in the openings 28 to form apertures 38 in the top metal layer 16. Preferably, the top metal layer 16 is etched to remove metal from the top metal layer 16. In embodiments in which the top metal layer 16 comprises copper, an acid etching solution such as HCl or CuCl may be used. As top metal layer 16 is etched, portions of the top metal layer 16 covered by the first resist layer 20 remain substantially unaffected and the etching is ceased before substantial portions of the top metal layer 16 beneath the first resist layer 20 are removed. Second resist layer 22 covers the bottom metal layer 18 to protect the bottom metal layer 18 during the etching process. Etching to form conductive features is well known in the microelectronic manufacturing, packaging and other fields.

Figure 5:
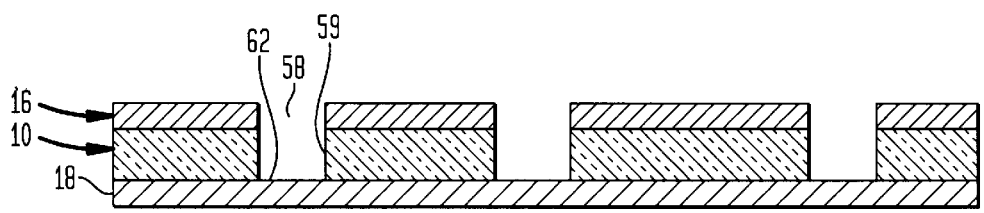
FIG. 5 is the cross-sectional view of FIG. 4, at a later stage in the method.

As shown in FIG. 5, the first resist layer 20 and second resist layer 22 are removed and vias 58 are formed in the dielectric layer 10. Preferably, the vias 58 are formed by cutting the dielectric layer 10 in the areas left uncovered by the apertures 38. The vias 58 may be formed utilizing a laser mask having holes positioned over top metal layer 16. The holes in the mask are aligned with the apertures 38 in the top metal layer 16. The portion of the dielectric layer 10 that is uncovered in the apertures, is cut, preferably utilizing a laser. The dielectric layer may also be cut to form vias 58 utilizing a YAG laser that has an unfocussed beam for cutting the dielectric layer without cutting the top metal layer. After forming the vias 58, the vias 58 have uncovered sides 59 of the dielectric layer 10. An uncovered portion 62 of bottom metal layer 18 is disposed in the via 58, as seen in FIG. 5.

Figure 6:
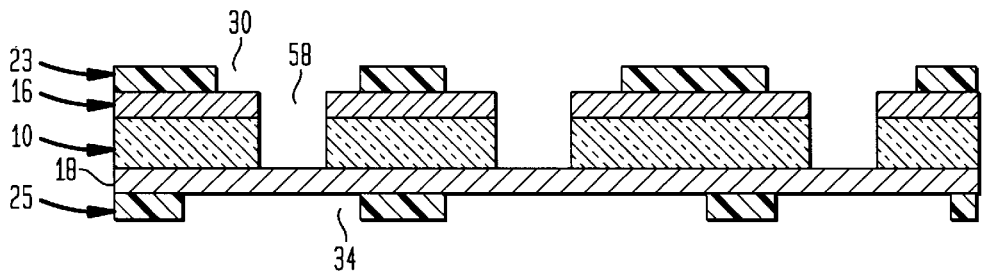
FIG. 6 is the cross-sectional view of FIG. 5, at a later stage in the method.

A third resist layer 23 is applied to the top metal layer 16 and a fourth resist layer 25 is applied to the bottom metal layer 18. As shown in FIG. 6, the third resist layer 23 is photolithographically patterned to form openings 30 aligned with the vias 58. The openings 30 are preferably annular in shape and surround the vias 58. The openings 30 leave a portion of the top metal layer 16 surrounding vias 58 uncovered. Fourth resist layer 25 is photolithographically patterned to form openings 34 that are aligned with the openings 30. Preferably, the third resist layer and fourth resist layer are patterned at the same time, to form openings in each at the same time, greatly simplifying the method.

Figure 7:
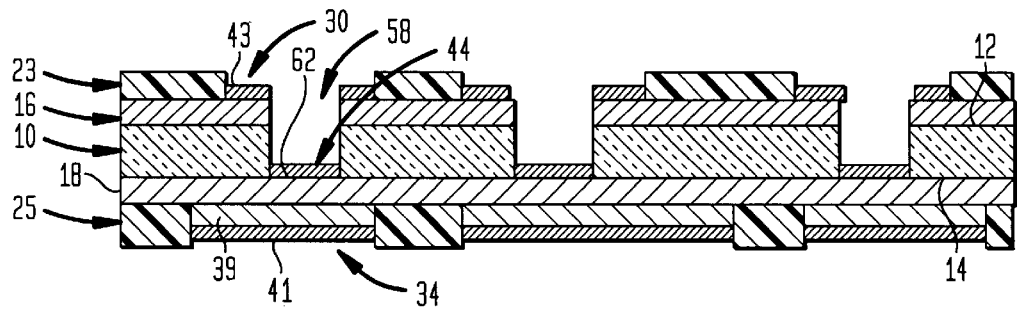
FIG. 7 is the cross-sectional view of FIG. 6, at a later stage in the method.

As shown in FIG. 7, a first metal 39 is deposited in the openings 34 in the fourth resist layer 25. The first metal 39 is deposited on the bottom metal layer 18 preferably by electroplating copper onto the bottom metal layer 18. Other methods of depositing metal may be used. For example, electroless or immersion deposition may be used to deposit the first metal 39. A second metal is deposited on the first metal 39 in each of the openings 34 to form a first cover layer 41. The second metal is preferably deposited by flash plating gold onto first metal 39, so that a relatively thin layer of gold is disposed on the first metal. As seen in FIG. 7, the second metal is also preferably deposited on the top metal layer 16, on the portions of the top metal layer 16 left uncovered in each of the openings 30 to form a second cover layer 43. Preferably, second metal is also deposited on each of the uncovered portions 62 of bottom metal layer 18, to form a third cover layer 44. Preferably, the second metal is deposited in all the foregoing areas at the same time, further simplifying the method.

Figure 8:
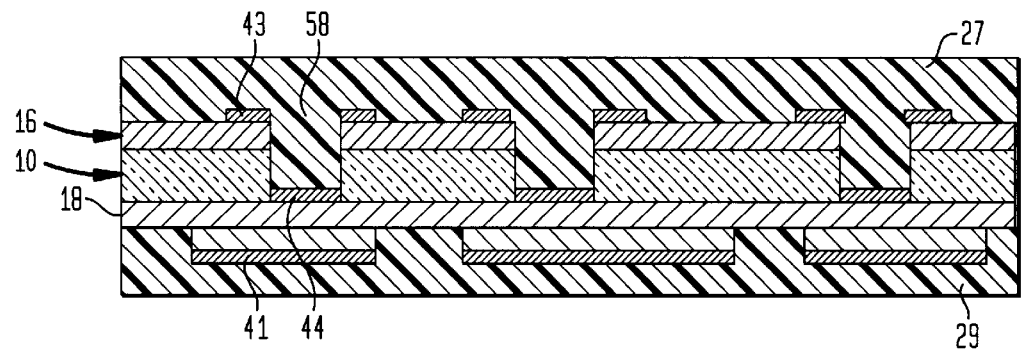
FIG. 8 is the cross-sectional view of FIG. 7, at a later stage in the method.

As shown in FIG. 8, openings 30 in the third resist layer 23 and vias 58 are covered, preferably using a fifth resist layer 27, and a sixth resist layer 29 is applied so as to cover the openings 34 in the fourth resist layer 25.

Figure 9:
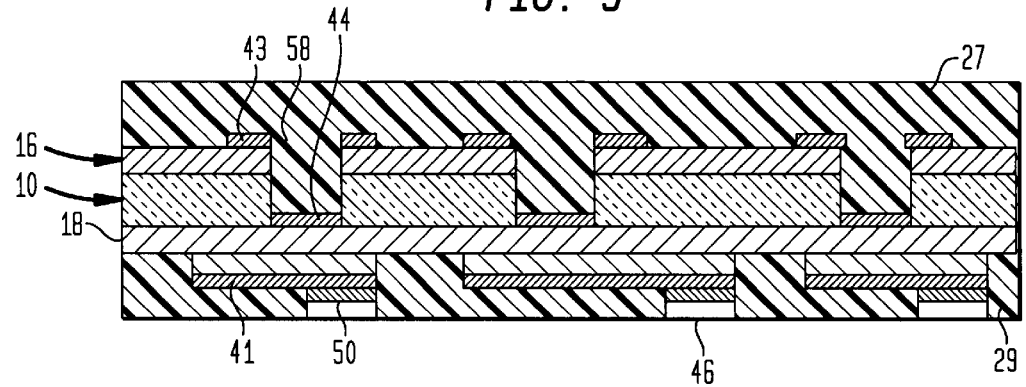
FIG. 9 is the cross-sectional view of FIG. 8, at a later stage in the method.
Figure 10:
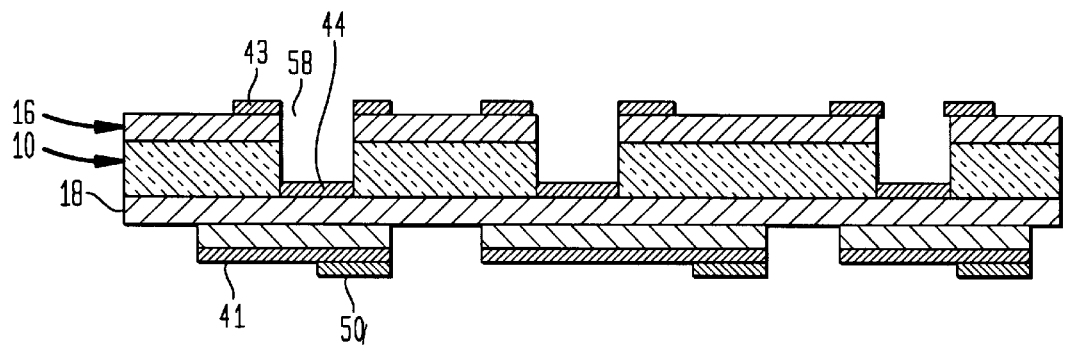
FIG. 10 is the cross-sectional view of FIG. 9, at a later stage in the method.

As shown in FIG. 9, the sixth resist layer 29 is photolithographically patterned to form openings 46. The openings 46 are formed so as to uncover a portion of each first cover layer 41. Second metal is deposited in the openings 46 to form pads 50 of second metal on the first cover layer 41. As shown in FIG. 10, fifth resist layer 27 and sixth resist layer 29 are removed after the pads 50 are formed.

Figure 11:
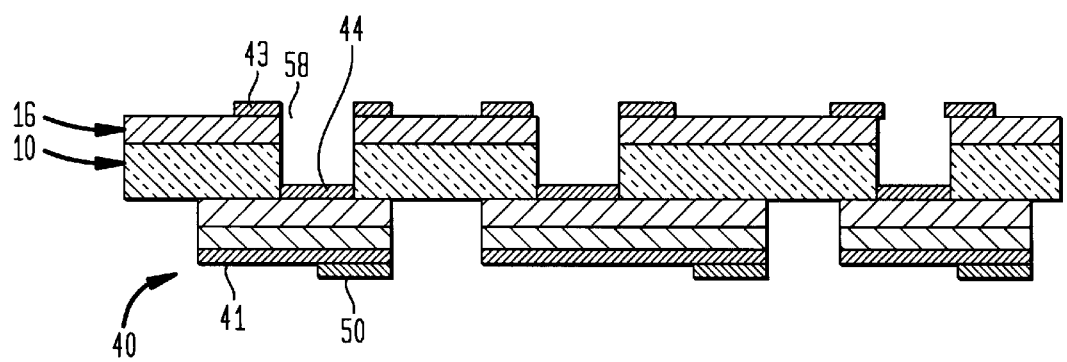
FIG. 11 is the cross-sectional view of FIG. 10, at a later stage in the method.
Figure 12:
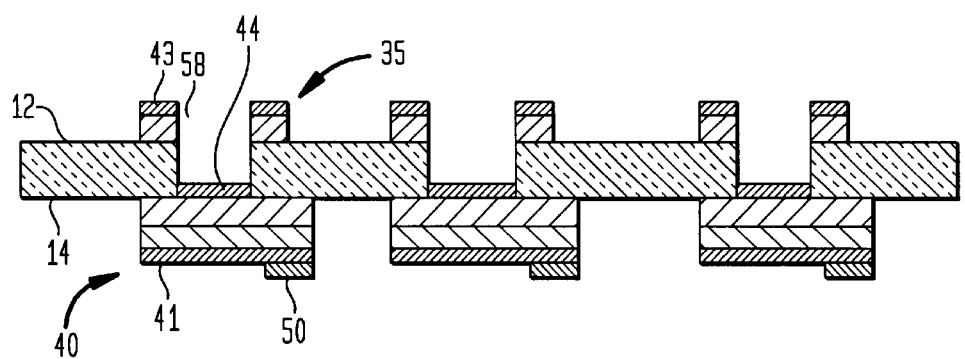
FIG. 12 is the cross-sectional view of FIG. 11, at a later stage in the method.

As shown in FIG. 11, metal is removed from portions of the bottom metal layer 18 left uncovered by the first cover layer 41 and pads 50 of second metal. Metal is also removed from portions of the top metal layer 16 left uncovered by the second cover layer 43. (FIG. 12). The third cover layer 44 of second metal protects the uncovered portion 62 of the bottom metal layer 18 while metal is removed from portions of top metal layer 16. Preferably, the portions of the top metal layer and bottom metal layer are removed by etching. Preferably, the top metal layer and bottom metal layer are etched at the same time, even further simplifying the method. In removing metal from the top metal layer, top conductive features 35 are formed on the top side 12 of the dielectric layer 10, and are isolated from one another. In removing metal from the bottom metal layer, bottom conductive features 40 are formed on the bottom side 14 and are isolated from one another. Portions of the top metal layer and bottom metal layer not aligned with the first cover layer 41, second cover layer 43 and third cover layer 44 are removed, while top conductive features and bottom conductive features remain. The second metal preferably has etching characteristics that are different from the etching characteristics of the first metal and the metal of the top metal layer 16 and bottom metal layer 18. For example, the second metal may comprise gold that is relatively unaffected by the HCl and CuCl enchants that may be utilized to remove copper.

Figure 13:
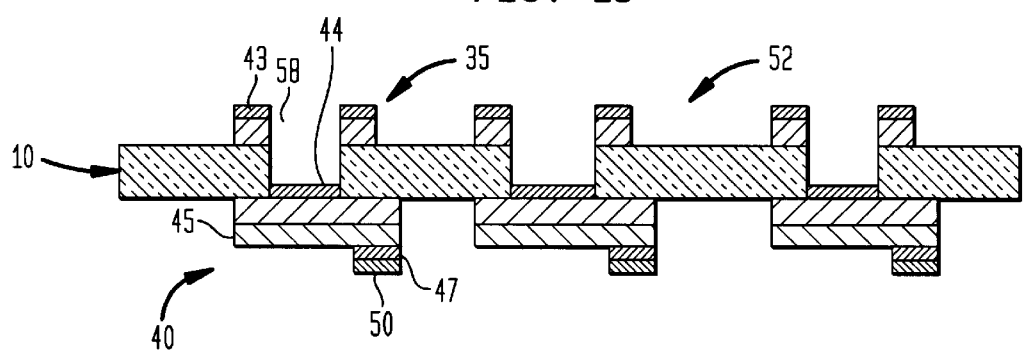
FIG. 13 is the cross-sectional view of FIG. 12 at a later stage in the method.

Referring to FIG. 13, the portion of the first cover layer 41 not covered by pads 50 is then removed. The cover layer 41 is also preferably removed by etching. In this embodiment, the pads 50 and cover layer 41 are comprised of second metal. As discussed above, cover layer 41 is preferably a relatively thin layer, as compared to the pads 50 so that the etching process may be halted after the cover layer 41 is removed but second metal from pads 50 remain on the conductive features 40.

In certain preferred embodiments, material is removed from portions of the dielectric layer 10 beneath pads 50 so that a first end 47 of each conductive element 40 is releasably attached to the dielectric layer 10, while a second end 45 remains permanently connected to the dielectric layer 10. For example, a gaseous etchant such as a plasma of a reactant gas including oxygen or other oxidizing gas is utilized to remove portions of the dielectric layer 10. Preferably, portions of the bottom conductive features 40 at the first end 47 are detached and unconnected to the dielectric layer 10 and other portions at the first end 47 of the conductive features 40 remain attached to the dielectric layer 10 after removing portions of the dielectric layer 10 at the first end 47. Preferably, the first end 47 of the bottom conductive features 40 is thereby made releasably connected to the dielectric layer 10, while a second end 45 remains permanently attached to the dielectric layer 10. A method of forming releasable conductive elements by removing portions of a dielectric layer beneath conductive elements is disclosed in certain embodiments of U.S. patent application Ser. No. 09/566,273, filed May 5, 2001 and 09/549,633, filed Apr. 14, 2000, the disclosures of which are hereby incorporated by reference herein.

Figure 14:
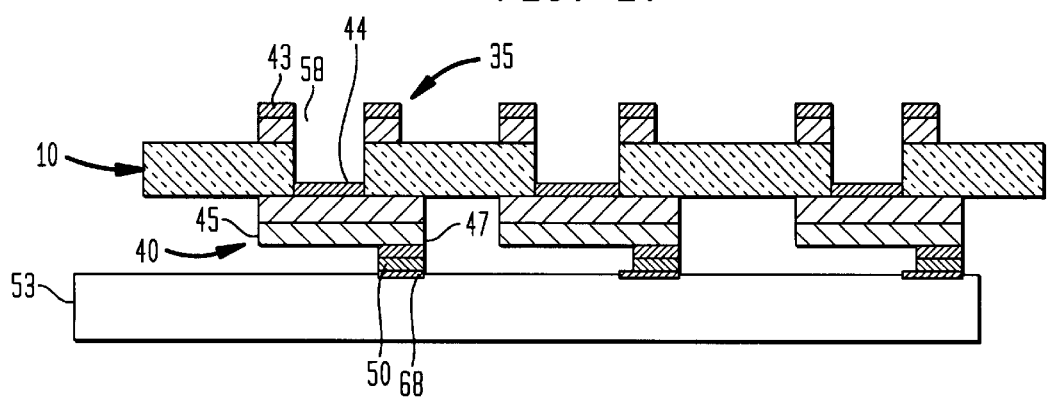
FIG. 14 is the cross-sectional view of FIG. 13, at a later stage in the method.

The completed component 52 is connected to a microelectronic element 53. The pads 50 of the component 52 are bonded to contacts 68 of the microelectronic element 53 that may comprise a semiconductor die. The component 52 is juxtaposed with the microelectronic element 53 so as to align the pads 50 with the contacts 68. The pads 50 may be bonded to the contacts 68 by applying a bonding material to the pads 50 and heating the bonding material to a sufficient temperature for activating the bonding material. (FIG. 14).

As used herein, "microelectronic element" includes a semiconductor chip, a packaged semiconductor chip, a temporary support layer, a sacrificial layer, a connection component, a printed circuit board, a wafer or tape of microelectronic elements, and a substrate. The component 52 may comprise a temporary support layer, a sacrificial layer, a connection component, a printed circuit board, a wafer or tape of microelectronic elements or a substrate.

Pads 50 are comprised of second metal. The second metal preferably comprises a metal that is compatible with the material of the contacts on the microelectronic element so that a connection is formed. The second metal is preferably selected so that the final alloy which is formed after bonding the contacts 68 to the pads 50 resists oxidation, forms a good electrical connection, and forms a good structural connection between the component 52 and the microelectronic element 53.

Figure 15:
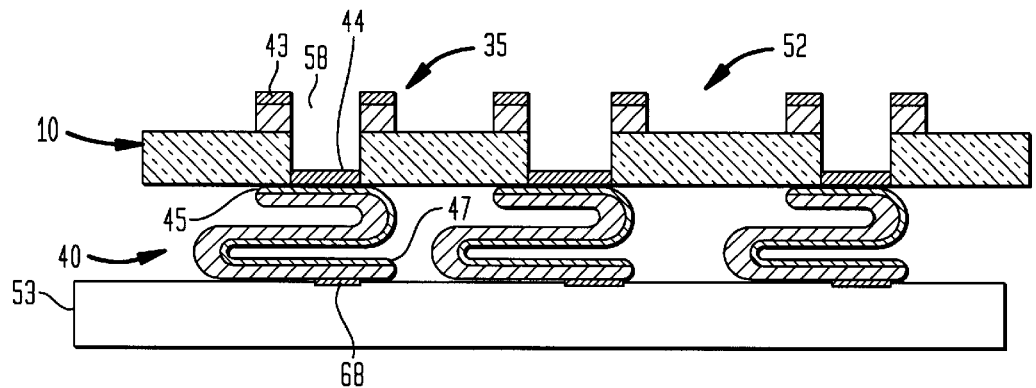
FIG. 15 is the cross-sectional view of FIG. 14, at a later stage in the method.

In certain preferred embodiments, the component 52 and the microelectronic element 53 are displaced with respect to one another so as to deform the bottom conductive features 40 into a vertically extensive configuration. Preferably, in displacing the component 52 with respect to the microelectronic element 53 the first end 47 of the bottom conductive elements 40 is detached from the dielectric layer 10 and moved away from dielectric layer 10. As second end 45 is permanently attached to the dielectric layer 10, the bottom conductive features 40 remain connected to the component 52. A portion of each bottom conductive feature 40 remains attached to the bottom side 14 of the dielectric layer 10 and to third cover layer 44 so that terminals formed on top conductive features 35 will be electrically connected to the bottom conductive features 40. In embodiments that do not include third cover layer 44, each conductive feature is attached to the dielectric layer 10 and disposed beneath a via 58 for connection with terminals. FIG. 15 shows S-shaped bottom conductive features. However, the bottom conductive features 40 may be deformed into other configurations.

Figure 16:
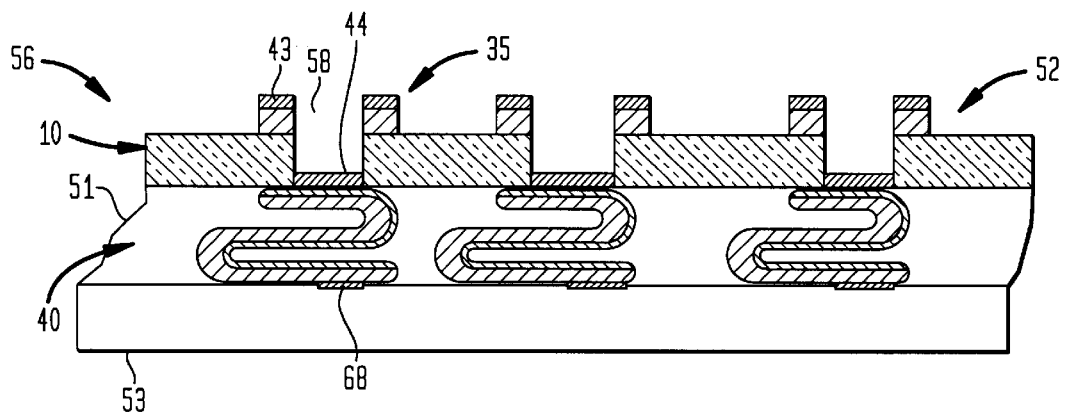
FIG. 16 is the cross-sectional view of FIG. 15, at a later stage in the method.

As shown in FIG. 16, an encapsulant 51 is preferably injected around component 52 and element 53 to form a package 56. Preferably, the encapsulant 51 is a dielectric material that is injected into the space between the microelectronic element 53 and the component 52. More preferably, the dielectric material 51 comprises a material curable to form a compliant material.

Figure 17:
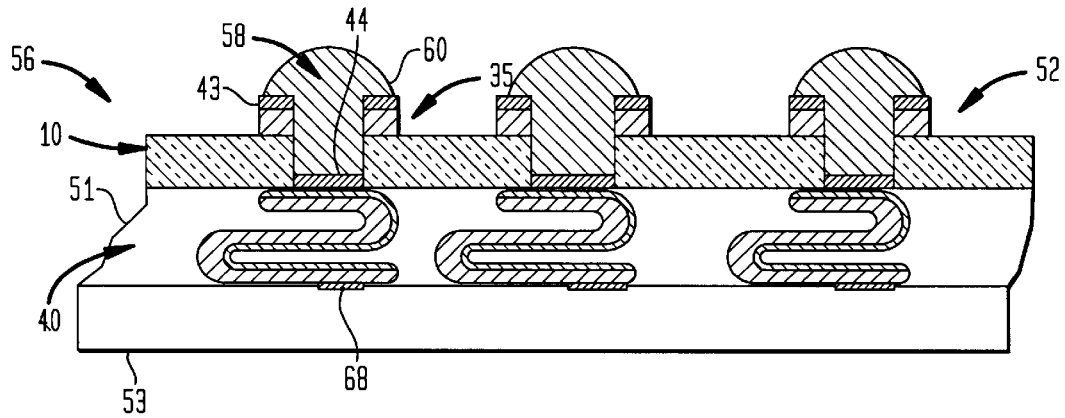
FIG. 17 is the cross-sectional view of FIG. 16, at a later stage in the method.
Figure 18:
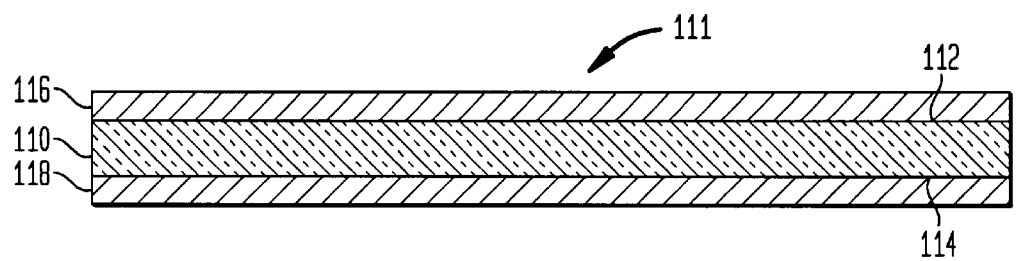
FIG. 18 is a schematic cross-sectional view of a structure in a method in accordance with a further embodiment of the invention.

The top conductive features 35 and bottom conductive features 40 are interconnected by depositing an electrically conductive material in the vias 58. This may be performed either before or after the step of bonding. In FIGS. 14–17 and in certain embodiments, the top conductive features 35 and bottom conductive features 40 are interconnected after the bottom conductive features 40 are bonded to the contacts 68 on the microelectronic element 53. The step of interconnecting the conductive features preferably includes applying a mass of conductive material 60 to each top conductive feature 35. The mass of conductive material 60 preferably comprises solder, which is subjected to reflow so that the solder wets the third cover layer 44 or bottom conductive feature 40, to form a ball shaped terminal, as shown in FIG. 17. Thus, the top conductive features 35 and bottom conductive features 40 are interconnected without lining the uncovered sides 59 of the vias 58 in a separate step, such as by seeding the vias 58.

The second metal of the second and third cover layers preferably comprises a metal which promotes adhesion between the mass of conductive material 60 and the top conductive features and bottom conductive features. For example, gold may be used as the second metal deposited in these areas. In other embodiments, the metal of any of the first, second and third cover layers comprise a different metal from the metal of the other cover layers.

Embodiments of the invention may be used to form microelectronic packages such as those disclosed in certain embodiments of U.S. Pat. Nos. 5,518,964 and 5,801,441, the disclosures of which are hereby incorporated by reference herein.

In other preferred embodiments, the third resist layer 23, or fourth resist layer 25, or both, which are discussed in connection with FIG. 6 above, may be photolithographically patterned so as to form openings that are not aligned with areas where top conductive features and bottom conductive features are to be formed. In these embodiments, the portions of the resist layers that remain after development are aligned with areas where the top conductive features and bottom conductive features are to be formed. Metal may then be removed from portions of the top metal layer and bottom metal layer that are left uncovered by the resist layers to form top conductive features and bottom conductive features.

Figure 19:
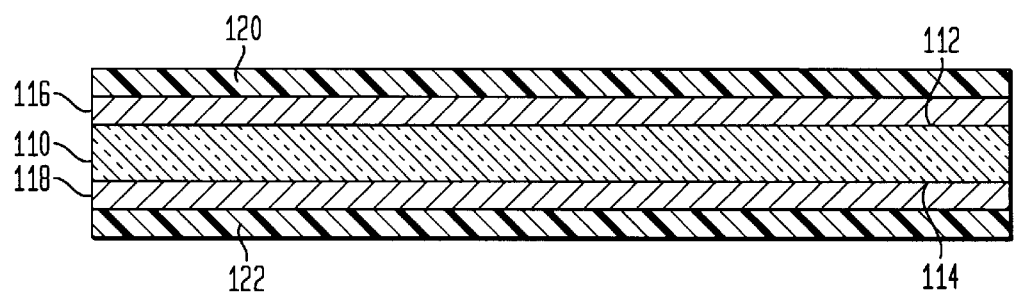
FIG. 19 is the cross-sectional view of FIG. 18, at a later stage in the method.

Another embodiment of the invention is shown in FIGS. 18–35. A structure 111 similar to the structure shown in FIG. 1 has a top metal layer 116 on a top side 112 of the dielectric layer 110 and has a bottom metal layer 118 on a bottom side 114 of the dielectric layer 110. A first resist layer 120 is applied to the top metal layer 116 and a second resist layer 122 is applied to the bottom metal layer 118, as shown in FIG. 19.

Figure 21:
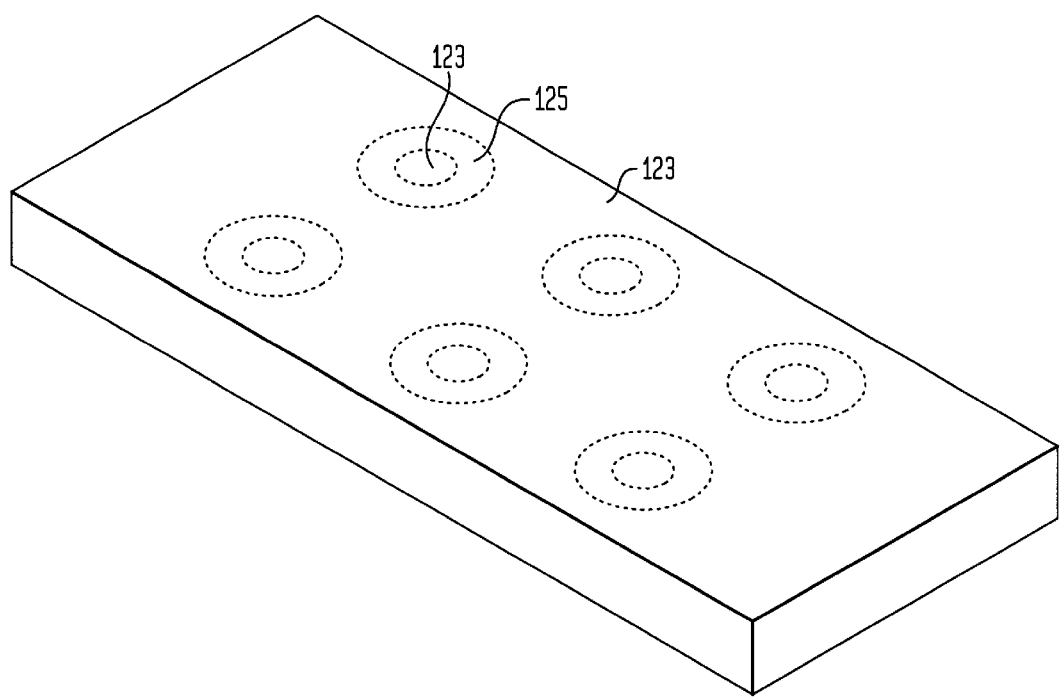
FIG. 21 is a front-right perspective view of the structure of FIG. 20.

The first resist layer 120 is preferably photolithographically patterned. The first resist layer 120 is exposed through a mask to form exposed portions 125 and unexposed portions 123. The mask has openings formed so that the exposed portions 125 have an annular shape and surround an unexposed portion 123, as shown in FIG. 21. An exposed portion 123 surrounds all of the annular exposed portions 125. Exposed portions 125 are aligned with portions of the top metal layer 116 which will be used to form top conductive features. The unexposed portions 123 in the center of each exposed portion 125 are aligned with areas in which the vias for the component will be formed.

Figure 20:
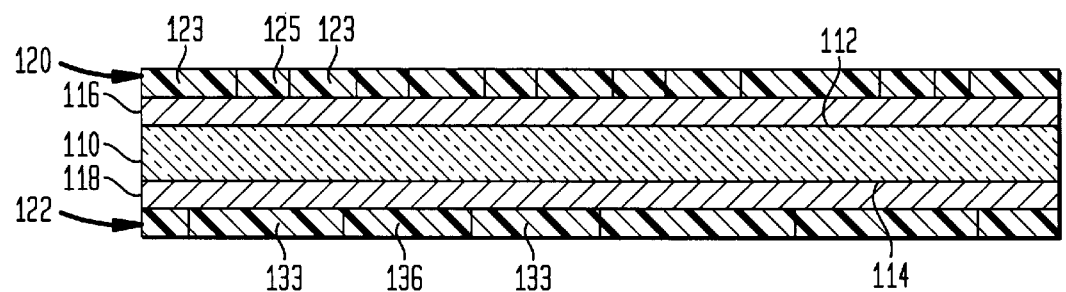
FIG. 20 is the cross-sectional view of FIG. 19, at a later stage in the method.

The second resist layer 122 is also preferably photolithographically patterned. The second resist layer 122 is exposed through a mask to form exposed portions 133 and unexposed portions 136 of the second resist layer 122. The exposed portions 133 coincide with the conductive features desired to be formed on the bottom metal layer 118. As shown in FIG. 20, the first resist layer 120 and second resist layer 122 are preferably exposed in the same step.

Figure 22:
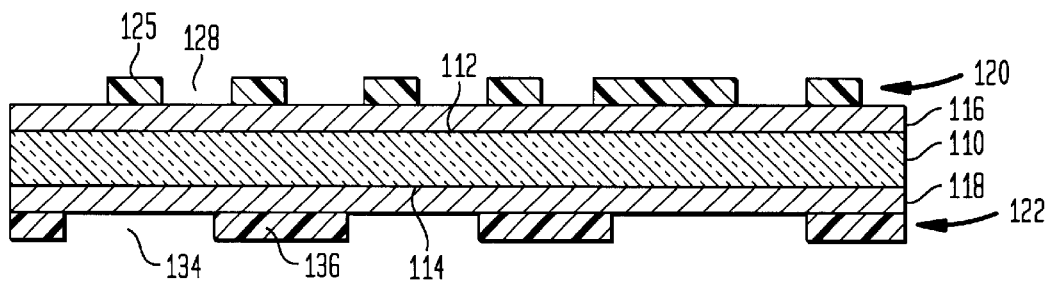
FIG. 22 is the cross-sectional view of FIG. 18, at a later stage in the method.

The first resist layer 120 is developed to remove the unexposed portions 123 of the first resist layer 120, forming openings 128. The exposed portions 125 remain on the dielectric layer 110. The openings 128 are disposed in the center of the annular exposed portions 125, as shown in FIG. 22. The second resist layer 122 is developed to remove exposed portions 133 and form openings 134 in the second resist layer 122. First openings 128 coinciding with the areas where vias will be formed, and second openings 134 coincide with areas where bottom conductive features will be formed.

In certain preferred embodiments, the first resist layer 120 and second resist layer 122 are developed in the same step, shown in FIG. 22.

As seen in FIG. 22, a portion of each opening 134 is aligned with an opening 128 so that bottom conductive features will be formed beneath vias. The steps of exposing and developing the second resist layer 122 are performed so as to form openings 134 having a shape corresponding to the shape of the desired conductive features.

Developing both first resist layer 120 and second resist layer 122 in the same step and exposing both resist layers in the same step reduces the number of process steps required in forming the microelectronic component. In other embodiments, the resist layers may be exposed or developed in the same step or in different steps.

Figure 23:
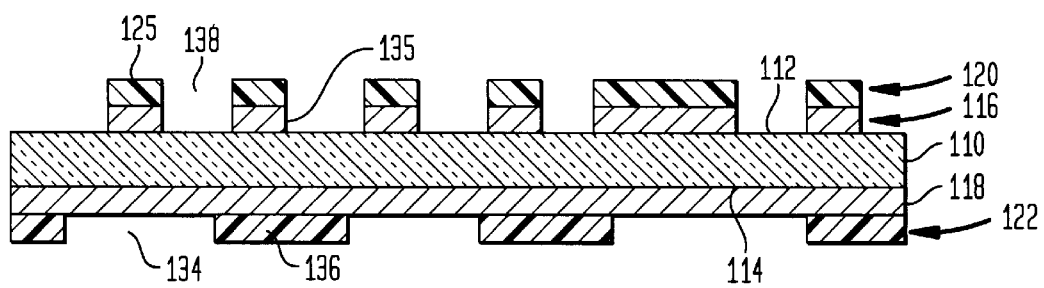
FIG. 23 is the cross-sectional view of FIG. 22, at a later stage in the method.

As shown in FIG. 23, metal is removed from the top metal layer 116 in the areas of top metal layer 116 left uncovered by the exposed portions 125 of the first resist layer 120 to form conductive features 135. Preferably, metal is removed from the top metal layer 116 by etching the portions of the top metal layer 116 left uncovered by the exposed portions 125 of the first resist layer 120. In removing metal from the top metal layer 120, apertures 138 are formed in the top metal layer 116. The apertures 138 are surrounded by exposed portions 125. Metal is also removed from those portions of top metal layer 120 which surround the exposed portions 125. The portions of the top metal layer that remain after etching comprise top conductive features 135. Thus, the conductive features 135 surround apertures 138, as shown in FIG. 23.

Thus, the first resist layer 120 is utilized to form the top conductive features 135. The conductive features 135 are formed so as to have apertures 138, which will be used to form the vias 158. By contrast, in the embodiment of FIGS. 1–17, the areas where vias 58 were formed were defined separately from the areas where top conductive features 35 were formed. Furthermore, the top conductive features 35 were formed from top metal layer 16 using second cover layer 43. Preferably, the areas for forming the top conductive features, bottom conductive features, and the vias are formed in as few steps as possible.

Figure 24:
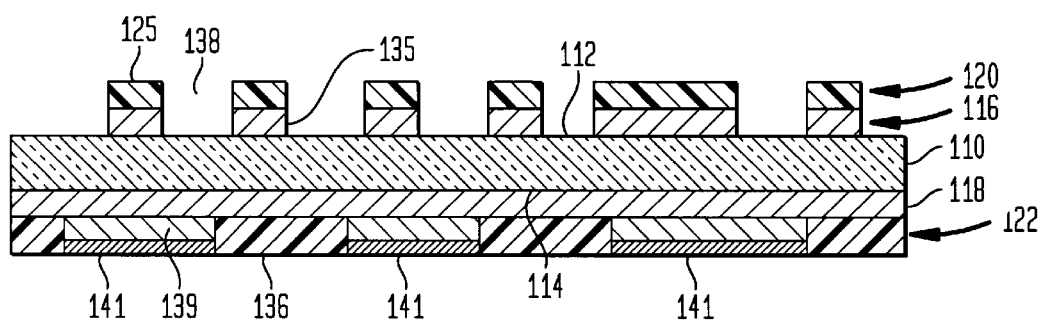
FIG. 24 is the cross-sectional view of FIG. 23, at a later stage in the method.

As shown in FIG. 24, metal is added to portions of the bottom metal layer 118 left uncovered by the openings 134 in the second resist layer 122. Preferably, a first metal 139 is deposited in the openings 134 in the second resist layer 122. The first metal may be deposited by electroplating a metal onto the bottom metal layer 118. Other methods of depositing the first metal on the bottom metal layer 118 may also be used. For example, electroless or immersionless deposition may be used. A second metal is preferably deposited on the first metal 139 to form a cover layer 141 of second metal. It is preferred that the second metal comprise a metal having different etching characteristics as compared to the etching characteristics of the first metal 139 and the bottom metal layer 118. The second metal may be deposited by flash plating gold onto the first metal so that a relatively thin layer of gold overlies the first metal 139 previously deposited on the bottom metal layer 118. For example, the first metal may comprise a layer having a thickness of about 1 to about 3 microns and about a 0.05 micron thick layer of gold may be deposited on the first metal 139 to form cover layer 141.

In other embodiments, either the top conductive features or the bottom conductive features may be formed by adding metal to a metal layer or removing metal from a metal layer.

Figure 25:
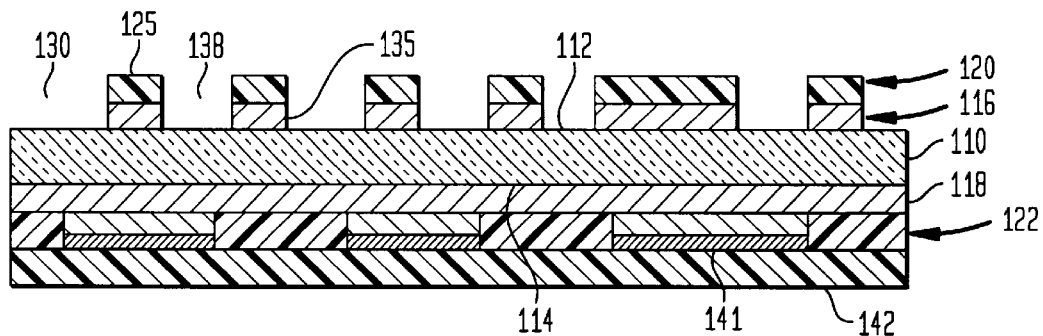
FIG. 25 is the cross-sectional view of FIG. 24, at a later stage in the method.
Figure 26:
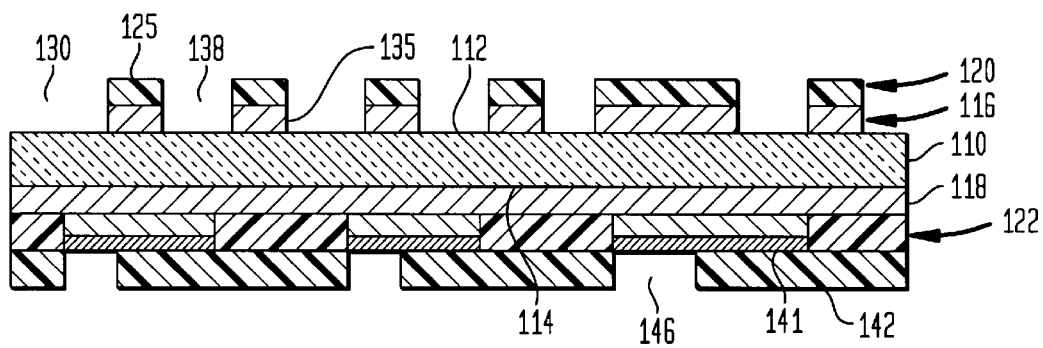
FIG. 26 is the cross-sectional view of FIG. 25, at a later stage in the method.
Figure 27:
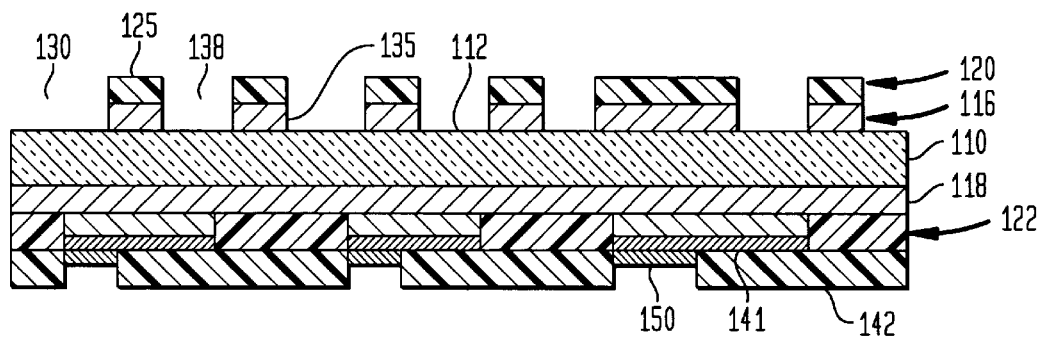
FIG. 27 is the cross-sectional view of FIG. 26, at a later stage in the method.

As shown in FIG. 25, the cover layer 141 of second metal is covered by applying a third resist layer 142 over the second resist layer 122. The third resist layer 142 is preferably photolithographically patterned to form openings 146, as shown in FIG. 26. The openings leave a portion of the cover layer 141 uncovered. As shown in FIG. 27, metal is deposited in the openings 146 in the third resist layer 142 to form a pad 150 on each cover layer 141. The metal deposited preferably comprises the second metal deposited to form the cover layers 141. For example, where gold is used to form the cover layer 141, gold may be added to the cover layer 141 by plating gold in the openings 146 to form the pads 150. Preferably, the second metal is added so that the second metal at the pads 150 is thicker than the relatively thin cover layer 141 of second metal. Merely by way of example, the cover layer 141 may comprise about a 0.05 micron thick layer of gold flash plated onto the first metal and the pads 150 may comprise about a 1 micron thick layer of gold plated onto the cover layer.

Figure 28:
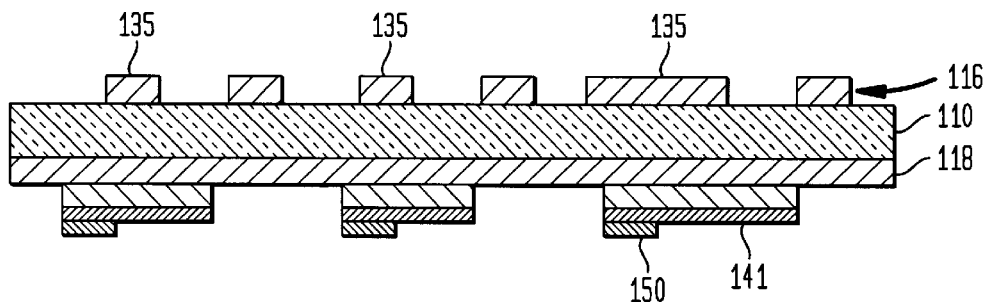
FIG. 28 is the cross-sectional view of FIG. 27, at a later stage in the method.

As shown in FIG. 28, the second resist layer 122 and the third resist layer 142 are removed. The first resist layer 120 is also removed, preferably in the same step as removing the second resist layer and third resist layer.

Figure 29:
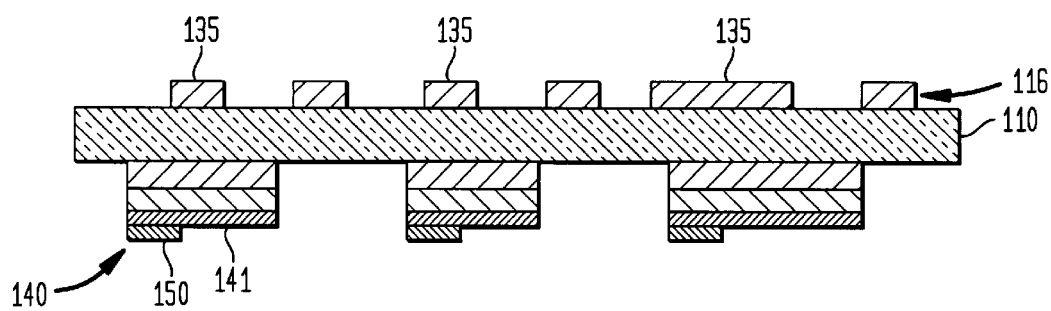
FIG. 29 is the cross-sectional view of FIG. 28, at a later stage in the method.

As shown in FIG. 29, portions of the bottom metal layer 118 are removed so that bottom conductive features 140, which are isolated from each other, are disposed on the bottom side 114 of the dielectric layer 110. The portions of the bottom metal layer 118 that are removed are those portions that are not aligned with the first metal 139, cover layer 141 and pad 50. Preferably, portions of the bottom metal layer 118 are removed by etching and preferably an etchant which leaves the second metal of the cover layer 141 and pads 150 relatively unaffected is utilized. The first metal 139 of the conductive elements 140 is covered by cover layer 141 of second metal and is relatively unaffected by the etching process. In etching the bottom metal layer 118, a single sided etch fixture may be used. However, the etching may be performed so that the top conductive features 135 are also etched, but the top conductive features 135 ultimately remain on the top side 12 of the dielectric layer 10 and the undesired portions of bottom metal layer 118 are removed. For example, the top metal layer 116, which was used to form the top conductive features 135, may comprise a thicker layer of the same metal as bottom metal layer 118. Alternatively, the top conductive features 135 may be protected by a resist.

Figure 30:
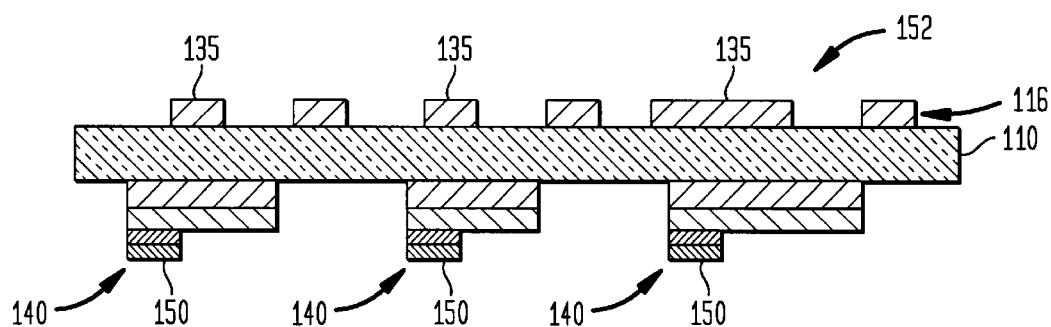
FIG. 30 is the cross-sectional view of FIG. 29 at a later stage in the method.
Figure 31:
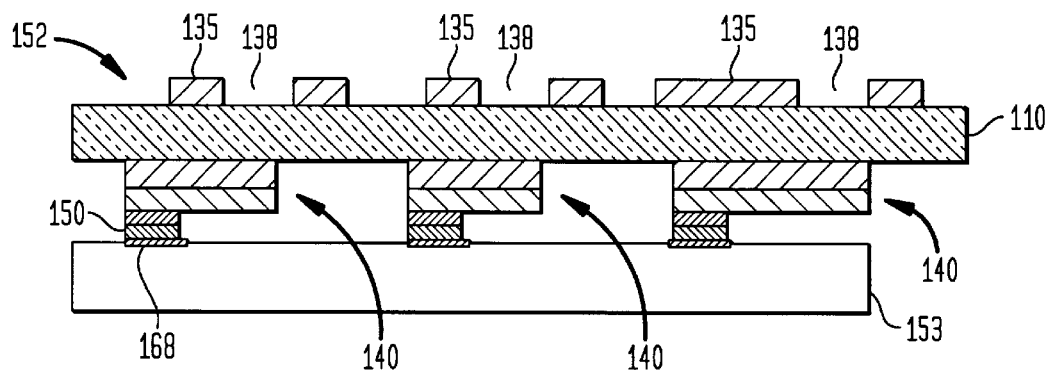
FIG. 31 is the cross-sectional view of FIG. 30, at a later stage in the method.

As shown in FIG. 30, the cover layer 141 of second metal is stripped from those portions of bottom conductive features 140 not covered by pads 150. The cover layer 141 may be removed from the bottom conductive features 140 by etching. The etching process is arrested prior to removal of the pads 150, but after the cover layer 141 is removed. Thus, the second metal at the pads 150 is preferably thicker than the relatively thin cover layer 141 of second metal on the other portions of the bottom conductive features 140. The resulting component 152 shown in FIG. 30 may be bonded to a semiconductor die or another microelectronic element 153 having contacts 168, as shown in FIG. 31. The component 152 is juxtaposed with microelectronic element 153 so as to align the pads 150 with the contacts 168 on the microelectronic element 153. The pads 150 may be bonded to contacts 168 by applying a bonding material to pads 150, and heating the bonding material to a temperature sufficient to activate the bonding material.

Figure 32:
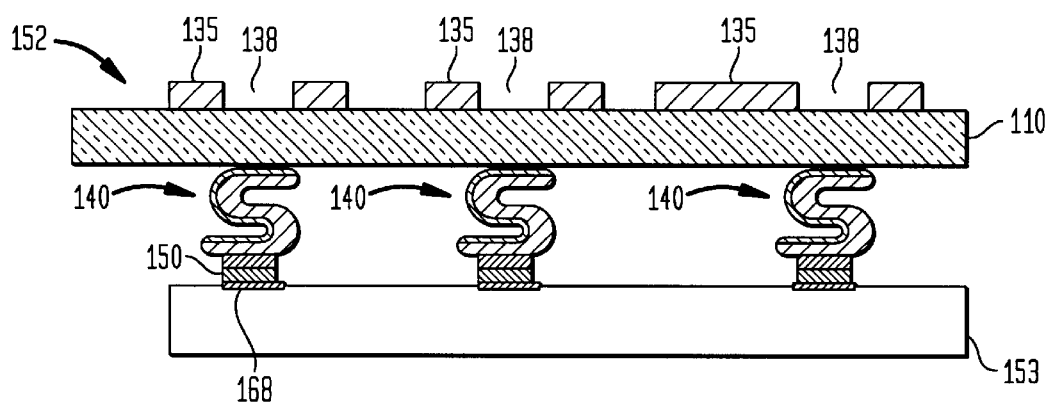
FIG. 32 is the cross-sectional view of FIG. 31, at a later stage in the method.
Figure 33:
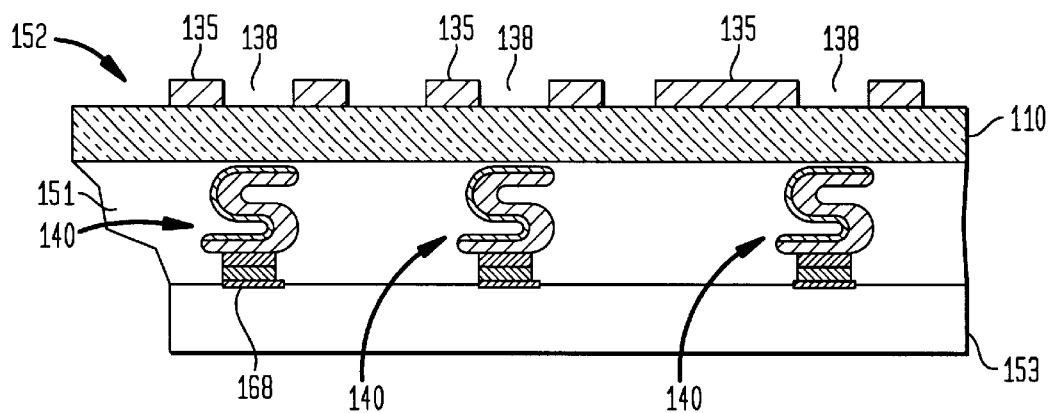
FIG. 33 is the cross-sectional view of FIG. 32, at a later stage in the method.

As shown in FIG. 32, the component 152 and microelectronic element 153 are, in certain preferred embodiments, displaced with respect to one another after bonding so as to deform the bottom conductive features 140 into a vertically extensive configuration. FIG. 32 shows S-shaped leads. However, bottom conductive features 140 may be deformed into any other configuration. An encapsulant 151 is preferably injected around component 152 and element 153 to form a package 156, as shown in FIG. 33. Preferably, encapsulant 151 is a dielectric material that is injected into the space between the microelectronic element 153 and the component 152. More preferably, the dielectric material 151 comprises a material that is curable to form a compliant material.

Figure 34:
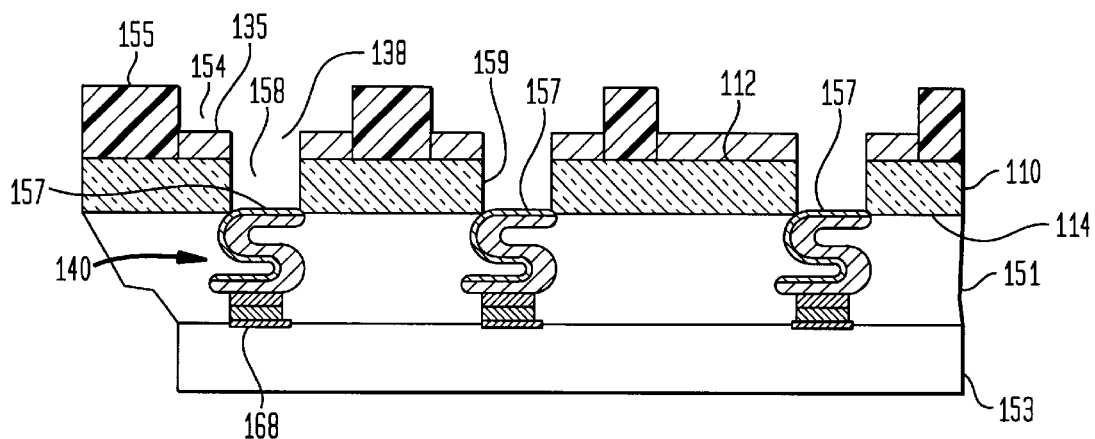
FIG. 34 is the cross-sectional view of FIG. 33, at a later stage in the method.

As shown in FIG. 34, vias 158 extending from the top side 112 of the dielectric layer 110 to the bottom side 114 of the dielectric layer are formed. To form the vias, a laser may be used to cut portions of the dielectric layer 110 that are aligned with the apertures 138. After forming the vias 158, sides 159 of the dielectric layer define the vias 158 and uncovered sides 157 of the bottom conductive features 140 are uncovered in the vias 158. Thus, the vias 158 are not formed until after the component 152 is bonded to the microelectronic element 153. In other preferred embodiments, the vias 158 are formed before the component 152 is bonded to the microelectronic element 153. For example, the vias 158 may be formed by cutting through the dielectric layer 110, after forming the top conductive features 135 in FIG. 23.

Figure 35:
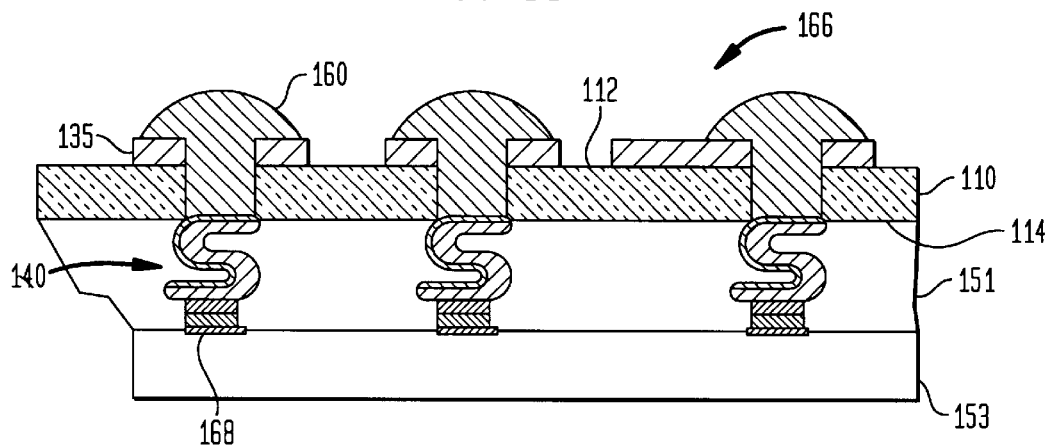
FIG. 35 is the cross-sectional view of FIG. 34, at a later stage in the method.

As shown in FIG. 35, a mass 160 of electrically conductive material is added in the vias 158 to electrically interconnect the top conductive features 135 and the bottom conductive features 140. The mass 160 of electrically conductive material is deposited in each via 158 so as to contact each conductive feature 135 and the uncovered side 157 of the conductive features 140. Preferably, the mass 160 of conductive material comprises a solder material applied to the top conductive features 135. The solder material is subjected to reflow, in which it is heated until the solder flows into the via 158 and contacts the uncovered side 157 of the bottom conductive feature. Enough electrically conductive material must be provided in mass 160 so that, after reflow, the mass 160 of material contacts the top conductive features 135 and the bottom conductive features 140. Preferably, the mass 160 of conductive material extends on the top conductive features 135 and substantially fills the vias 158. Thus, the top conductive features 135 and bottom conductive features 140 are interconnected without lining the sides 159 of the vias 158 in a separate step, such as by seeding the vias 158. After interconnecting the top conductive features 135 and the bottom conductive features 140, the package 166 is as shown in FIG. 35.

In the embodiment of FIGS. 1–17, and the embodiment of FIGS. 18–35, the top and bottom conductive features are interconnected after the component is bonded to the microelectronic element.

In other embodiments, the vias 158 are formed after forming the top conductive features 135 (shown in FIG. 23, and the top conductive features 135 and bottom conductive features 140 are interconnected before the step of bonding the component 152 to the microelectronic element 153.

Although the figures show only three vias for ease of illustration, a typical package may include many more vias, top conductive features and bottom conductive features than depicted in the Figures. The Figures are schematic drawings and are not drawn to scale.

The dielectric layer discussed above may comprise a tape utilized in a tape automated bonding process ("TAB Process"). In a TAB process, a plurality of microelectronic elements are assembled with the dielectric tape and the dielectric tape has terminals and other conductive features in areas corresponding to microelectronic elements. In addition, the dielectric layer may comprise a sheet of a plurality of individual components to be assembled with a microelectronic element comprising a wafer having a plurality of semiconductor chips, as disclosed in certain embodiments of U.S. Pat. Nos. 5,518,964 and 5,801,441, the disclosures of which are hereby incorporated by reference herein. Conductive features on the top side of the dielectric sheet may be connected to the conductive features on the bottom side of the sheet by adding a electrically conductive material in the vias. The top and bottom conductive features may be electrically connected either before or after the step of bonding the sheet of components to the wafer. In addition, the vias may be formed either before or after the step of bonding the sheet of components to the wafer.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A method of forming a microelectronic element, comprising:
   a) providing a dielectric layer with a top side, a bottom side, a top metal layer on the top side, and a bottom metal layer on the bottom side;
   b) forming first apertures in the top metal layer and forming vias in the dielectric layer aligned with the first apertures;
   c) applying a first resist to the top metal layer, applying a second resist to the bottom metal layer and patterning the first resist and second resist in the same step to form first openings in the first resist and second openings in the second resist,
   d) the first openings leaving uncovered portions of the top metal layer surrounding the vias, and the second openings being aligned with the first openings;
   e) forming top conductive features from portions of the top metal layer aligned with said first openings and bottom conductive features on portions of the bottom metal layer aligned with said second openings; and
   f) electrically interconnecting the top conductive features and the bottom conductive features through the vias by depositing electrically conductive material in the vias without seeding the vias.

2. A method as claimed in claim 1, wherein the step of forming first apertures is performed before applying a first resist and applying a second resist.

3. A method as claimed in claim 1, wherein the step of patterning the first resist and second resist comprises photolithographically patterning the first resist and second resist.

4. A method as claimed in claim 3, wherein the step of patterning comprises exposing the first resist and second resist in the same step and then developing the first resist and the second resist in the same step.

5. A method as claimed in claim 1, wherein the top conductive features are formed as annular features surrounding the vias.

6. A method as claimed in claim 1, wherein the step of forming the bottom conductive features includes depositing a first metal in the second openings of the second resist.

7. A method as claimed in claim 6, further comprising adding a second metal on the first metal.

8. A method as claimed in claim 7, further comprising adding the second metal on the top metal layer on the portions of the top metal layer left uncovered by the first openings.

9. A method as claimed in claim 8, wherein the step of forming top conductive features and bottom conductive features comprises removing metal from portions of the top metal layer and the bottom metal layer that are left uncovered by the second metal.

10. A method as claimed in claim 9, wherein the second metal has different etching characteristics than the etching characteristics of the top metal layer and the bottom metal layer and metal is removed from the top metal layer and the bottom metal layer by etching.

11. A method as claimed in claim 10, wherein the first metal comprises copper and the second metal comprises gold.

12. A method as claimed in claim 11, wherein the top metal layer and the bottom metal layer comprise layers of copper.

13. A method as claimed in claim 7, further comprising:
   a) applying a third resist covering the second metal and the bottom metal layer;
   b) patterning the third resist to form third openings in the third resist that uncover a portion of the second metal deposited on the first metal; and
   c) depositing second metal in the third openings to form pads.

14. A method as claimed in claim 1, wherein the step of forming first apertures in the top metal layer comprises applying a third resist on the top metal layer, patterning the third resist to form third openings, and removing metal from portions of the top metal layer left uncovered in the third openings.

15. A method as claimed in claim 14, wherein the step of forming vias comprises cutting through the dielectric layer at the first apertures.

16. A method of making a microelectronic component, comprising:
   a) providing a dielectric layer with a top side, a bottom side, a top metal layer on the top side, and a bottom metal layer on the bottom side;
   b) forming first apertures in the top metal layer and top conductive features surrounding the first apertures, the top conductive features being formed from portions of the top metal layer;
   c) forming bottom conductive features at portions of the bottom metal layer,
   d) the bottom conductive features being aligned with the first apertures;
   e) forming vias in the dielectric layer aligned with the first apertures; and
   f) electrically interconnecting the top conductive features and the bottom conductive features through the vias by depositing electrically conductive material in the vias without seeding the vias.

17. The method of claim 16, wherein the first apertures and top conductive features are formed by applying a first resist to the top metal layer, and patterning the first resist to form first openings.

18. The method of claim 17, wherein the first apertures and top conductive features are formed by removing metal from portions of the top metal layer uncovered in the first openings.

19. The method of claim 18, wherein the bottom conductive features are formed by applying a second resist to the bottom metal layer and patterning the second resist to form second openings.

20. The method of claim 19, wherein the bottom conductive features are formed by adding a first metal to the portions of the bottom metal layer that are uncovered in the second openings.

21. The method of claim 20, further comprising adding a second metal on the first metal added in the second openings.

22. A method as claimed in claim 21, further comprising:
   a) applying a third resist covering the second metal and the bottom metal layer;
   b) patterning the third resist to form third openings in the third resist that uncover a portion of the second metal deposited on the first metal; and
   c) depositing second metal in the third openings to form pads.

23. A method as claimed in claim 1, wherein the step of forming bottom conductive features is performed so that said bottom conductive features cover the bottoms of said vias.

24. A method of forming a microelectronic element, comprising:
   a) providing a dielectric layer with a top side, a bottom side, a top metal layer on the top side, and a bottom metal layer on the bottom side;
   b) forming first apertures in the top metal layer and forming vias in the dielectric layer aligned with the first apertures;
   c) applying a first resist to the top metal layer, applying a second resist to the bottom metal layer and patterning the first resist and second resist in the same step to form first openings in the first resist and second openings in the second resist,
   d) the first openings leaving uncovered portions of the top metal layer surrounding the vias, and the second openings being aligned with the first openings;
   e) forming top conductive features from portions of the top metal layer aligned with said first openings and bottom conductive features on portions of the bottom metal layer aligned with said second openings; and
   f) electrically interconnecting the top conductive features and the bottom conductive features through the vias by depositing a mass of conductive material in the vias without seeding the vias.

25. A method as claimed in claim 24, wherein said mass of conductive material comprises a mass of solder.

26. A method as claimed in claim 24, wherein the step of forming bottom conductive features is performed so that said bottom conductive features cover the bottoms of said vias.

* * * * *